United States Patent
Finn et al.

[11] Patent Number: 6,088,230
[45] Date of Patent: *Jul. 11, 2000

[54] PROCEDURE FOR PRODUCING A CHIP MOUNTING BOARD AND CHIP-MOUNTING BOARD THUS PRODUCED

[76] Inventors: David Finn, Konig-Ludwig-Weg 24, D-87459 Pfronten; Manfred Rietzler, Am Alsterberg 10, D-87616 Marktoberdorf, both of Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/716,285
[22] PCT Filed: Mar. 26, 1995
[86] PCT No.: PCT/DE95/00416
    § 371 Date: Sep. 20, 1996
    § 102(e) Date: Sep. 20, 1996
[87] PCT Pub. No.: WO95/26538
    PCT Pub. Date: Oct. 5, 1995

Related U.S. Application Data
[60] Provisional application No. 60/004,117, Sep. 21, 1995.

[30]     Foreign Application Priority Data
Mar. 28, 1994 [DE] Germany .............................. 44 10 732

[51] Int. Cl.⁷ ..................................................... H05K 7/02
[52] U.S. Cl. .......................... 361/737; 361/748; 361/765; 361/772; 361/774; 361/777; 361/783; 361/807; 257/690; 257/723; 257/724; 257/773; 257/782; 174/52.4

[58] Field of Search ..................................... 361/737, 748, 361/765, 772, 774, 777, 783, 760, 764, 820, 821, 807; 257/690, 691, 723, 724, 773, 782, 783, 784, 787, 735, 737; 174/52.4

[56]              References Cited

U.S. PATENT DOCUMENTS

| | | | |
|---|---|---|---|
| 4,857,893 | 8/1989 | Carroll | 340/572.7 |
| 5,227,659 | 7/1993 | Hubbard | 257/531 |
| 5,281,855 | 1/1994 | Hadden et al. | 257/784 |
| 5,396,101 | 3/1995 | Shiga | 257/531 |
| 5,541,399 | 7/1996 | De Vall | 235/491 |
| 5,566,441 | 10/1996 | Marsh et al. | 29/600 |
| 5,574,470 | 11/1996 | De Vall | 343/895 |
| 5,604,383 | 2/1997 | Matsuzaki | 257/778 |
| 5,608,417 | 3/1997 | De Vall | 343/895 |
| 5,705,852 | 1/1998 | Orihara et al. | 257/679 |

*Primary Examiner*—Leo P. Picard
*Assistant Examiner*—David Foster
*Attorney, Agent, or Firm*—Darby & Darby

[57]              ABSTRACT

Procedure for producing a transponder unit (55) provided with at least one chip (16) and one coil (18), and in particular a chip card/chip-mounting board (17) wherein the chip and the coil are mounted on one common substrate (15) and the coil is formed by installing a coil wire (21) and connecting the coil-wire ends (19, 23) to the contact surfaces (20, 24) of the chip on the substrate.

12 Claims, 3 Drawing Sheets

PROCEDURE FOR PRODUCING A CHIP MOUNTING BOARD AND CHIP-MOUNTING BOARD THUS PRODUCED

This application is a 371 of PCT/DE95/00416 filed Mar. 26, 1995 and also claims priority under 35 U.S.C. §119 of U.S. application ser. No. 60/004,117, filed Sep. 21, 1995.

FIELD OF THE INVENTION

This present invention covers a procedure for producing a transponder unit provided with at least one chip and a coil, and in particular a chip-mounting board where the chip and the coil are mounted on one common substrate and the coil is formed by the installation of a coil wire and the ends of the coil wire are connected with the contact surfaces of the chip on the substrate.

BACKGROUND OF THE INVENTION

The procedures employed in prior art for producing chip-mounting boards involve the placement of coils for instance on a film carrier into which the individual windings are etched, as described in EP-A2-0 481 776, or of separate, prewound coils which are then mounted on a board substrate either together with the chip as one assembly or as individual components to be connected with the chip on the substrate.

The aforementioned etching process used to apply coil windings on a substrate is very complex and the process lends itself only to coils having a relatively low copper density, which means that transponder units so equipped offer correspondingly low transmitting power. Using prewound coils in the production of a transponder in turn involves complicated coil handling in the insertion and attachment of the coils followed by fusing or gluing the coil to the substrate. Hence, apart from the coiling process proper, additional processing and handling steps are required in producing a transponder unit employing a prewound coil. The overall procedure is thus again quite complex, time-consuming and expensive.

OBJECTS AND SUMMARY OF THE INVENTION

The objective of the invention here presented is to provide a procedure for producing a chip-mounting board, and the chip-mounting board itself, which permits simple and cost-effective production of such chip-mounting boards.

This objective is realized by means of a procedure for producing a chip-mounting board characterized by the procedural features according to claim 1, and a chip-mounting board having the design features according to claim 4.

In the procedure according to this invention, the chip and the coil are mounted on one common substrate and the transponder unit is created in that a coil wire is laid out on the substrate in a way as to form a coil and the ends of the coil wire are connected to the contact surfaces of the substrate-mounted chip.

Applying the coil-wire windings directly on the substrate obviates the need for the use of a prewound coil and the handling and mounting of the latter on the chip. Instead, the coil is created on the substrate itself, which offers the added benefit of permitting the formation of the coil and the connection of the coil-wire ends to the contact surfaces of the chip in one continuous or nearly simultaneous operation.

In a particularly desirable approach, the procedure begins with the connection of one coil-wire end to a first contact surface of the chip, followed by the application of the coil windings on the substrate and, finally, the connection of the open coil-wire end to a second contact surface of the chip. As the coil wire is laid out to form the coil, the coil wire is attached to the substrate at least in some locations so as to give the coil a fixed, rigid structure.

This "embedded" coil thus eliminates not only the separate winding process used in producing a conventional prewound coil but also the mutual "baking-together" of the individual windings required in conventional prewound coils.

In a manner similar to that in attaching the coil wire of the embedded coil to the substrate, the chip can be bonded to the substrate at the time the chip is mounted. This eliminates the need for special positioning provisions on the substrate. Instead, the entire transponder unit can be applied to an unpreprocessed, flat surface of the substrate.

The embedding or bonding of the coil wire or the chip can be accomplished by thermal compression, i.e. thermally softening the surface of the substrate to allow the coil wire or chip to be pressed in, or by any other suitable process such as "rubbing" it into the surface using ultrasound.

A particularly useful approach in installing the coil wire so as to be bonded to the substrate at least in some locations and for connecting the coil-wire ends to the contact surfaces of the chip involves the use of a bonding head, described in detail as a winding/bonding device in the same claimant's German patent application P 43 25 334.2. This bonding head incorporates the functionalities of a wire guide, a wire-connecting device and a wire cutter and is movable relative to the substrate. The chip can be mounted using a pick-and-place device that may be employed in conjunction with the above-mentioned bonding device.

The chip-mounting board according to this invention offers the features described in claim 4 and is provided with a substrate-mounted transponder unit which includes at least one chip and one coil, the coil-wire ends of which are connected with contact surfaces of the chip, wherein one or several coil-wire windings constituting the coil is/are placed in one plane on the substrate and bonded to the substrate at least in some locations.

The chip-mounting board according to this invention, by virtue of its design, permits production by a method which offers the advantages already mentioned above in conjunction with the procedure according to this invention, meaning production that is considerably simpler than that of conventional chip-mounting boards.

The term "chip-mounting board" is intended to cover all transponder applications employing a board- or card-like substrate. This also includes for instance fixed modules or plug-in boards which, unlike data boards or ID cards, are not subject to constant handling.

Placing the individual coil-wire windings in one plane offers the special advantage of giving the coil substantially higher transverse, flexural strength than that of complex, three-dimensional prewound coils. This in turn greatly improves the functional reliability of the chip-mounting board even when exposed to frequent bending stress.

Moreover, the coil produced by the embedded-application process may be positioned anywhere on the substrate without its contour having to abide by the constraints of a predetermined winding matrix. A particularly advantageous approach in this context involves an at least partially meandering or zigzag configuration of the coil-wire windings in their application on the substrate. The coil can thus be made particularly sturdy in terms of flexural strength in that part of the substrate which is most affected by bending stress, thus further increasing the aforementioned operational reliability of a chip-mounting board provided with this type of coil.

The substrate of the chip-mounting board according to this invention may also support other components in addition to the coil and the chip. This is possible by virtue of the above-mentioned fact that the "embedded" coil does not have to follow a particular predetermined pattern but may be configured in any desired fashion. This allows the placement of complex assemblies on the substrate, with the spaces between the individual components being available for installing the coil wire.

One desirable variation of the substrate-mounted assembly design involves the integration of a membrane-type touch-sensitive key or keyboard. This makes it possible to manually activate the transponder unit or to enter data such as a key code.

Depending on the intended use of the chip-mounting board, the substrate and the components mounted thereon may at least in part be covered with a layer which may serve either as a purely protective coating or as a functional layer carrying, for instance, advertising or visual identification information.

The following describes a preferred implementation of the procedure according to this invention as well as a preferred design version of the chip-mounting board according to this invention, with the aid of the diagrams.

DETAILED DESCRIPTION OF THE PREFERRED EMBODIMENTS

Figure 1:
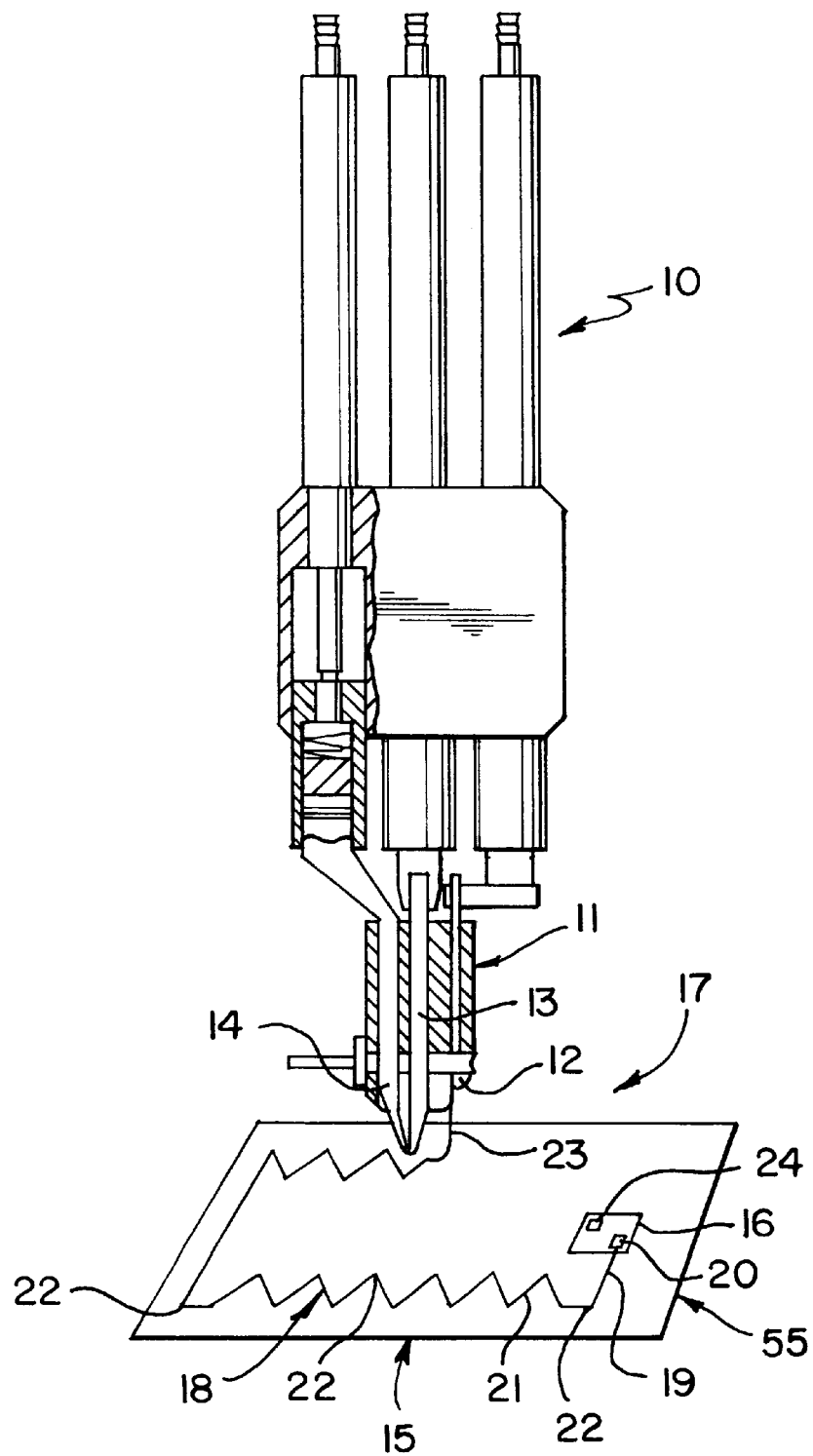
FIG. 1 shows a device for installing a coil wire on a substrate, as a design example serving to explain the procedure according to this invention.

FIG. 1 depicts the design of an embedding/bonding device 10 as described in the German patent application P 43 25 334.2 and included in this present patent application by way of reference as to its technical substance, incorporating tools attached to and guided by a tool holder 11, such as a wire guide 12, a wire-connecting device 13 and a wire cutter 14. The aforementioned patent application describes these tools in detail so that the following description need not go into specifics.

Located underneath the embedding/bonding device 10 is a board-shaped substrate 15 carrying a chip 16 so as to form a chip card 17.

The chip 16 is mounted on the substrate 15 for instance by means of a pick-and-place device, not illustrated in detail. The chip 16 can be attached to the substrate 15 for instance by way of an adhesive layer preapplied on the top surface of the substrate 15 or bottom surface of the chip 16. The chip may also be applied in the form of a chip module together with its own chip substrate.

Producing a coil 18 on the chip card 17 begins by connecting a free coil-wire end 19, emanating from the wire guide 12, to a first contact surface 20 of the chip 16. To that effect, the coil-wire end 19 of a coil wire 21 paid out by the wire guide 12 is clamped between the wire-connecting device 13, in this case of the thermal compression type, and a first contact surface 20 of the chip 16 and connected to the latter. For connecting to the contact surface a relatively thick coil wire such as the wire used in RF coils, having a diameter of about 100 $\mu$m, soldering has been found to be a preferred method, where the contact surfaces of the chip are in the form of tin-coated gold bumps. If, due to its composition, the coil wire used is bondable without (baked-enamel) insulation, the coil wire may be directly connected to the aluminum pads of the chip. In this case it will be particularly useful to make the connection using the ultrasound or the thermal compression process.

When insulated wire is used, it may be desirable to strip the wire by means of the wire stripper that is integrated in the embedding/bonding device. The wire stripper may be combined with a length-measuring system for marking the correct point where the insulation is to be stripped as a function of the length of the embedded coil. When a laser bonding unit is incorporated in the said embedding/bonding device, it can also double as a wire stripper.

Following the connection of the coil-wire end 19 to the first contact surface 20, the coil wire 21 is now laid out by means of the embedding/bonding device 10. To that effect, as shown in FIG. 1, the coil wire 21 is guided by the wire guide 12 across the substrate surface, partly in a straight line and partly along a meandering path, and at every point where the coil wire 21 changes direction it is bonded to the surface of the substrate 15 at the connecting points 22. To accomplish this, the wire guide 12 and the embedding/bonding device 10 are jointly moved in a biaxial (X-Y) direction across the plane of the substrate 15 and at every connecting point 22 the bonding device 13 makes a dipping movement (along the Z-axis), whereby the coil wire is temporarily clamped between the bonding unit 13 and the surface of the substrate and then pressed and thermally fused into the latter.

Following the formation of a coil 18 of the design shown in FIG. 1, a coil-wire end 23 paid out by the wire guide 12 is clamped by the bonding device 13 against a second contact surface 24 of the chip 16 and thermally as well as pressure-bonded to that surface. Thereupon the wire cutter 14 is activated to cut the end 23 of the continuous coil wire, the result of the process being a transponder unit 55 surface-mounted on the substrate 15 and consisting of the chip 16 and the coil 18 connected therewith.

In the form illustrated in FIG. 1, the embedding/bonding device 10 described above serves as an example only. Correspondingly, the bonding unit 13 of the embedding/bonding device 10 may be designed for instance as an ultrasonic (thermosonic) bonding unit, or it may be equipped with a laser bonding head and a fiber-optic cable which head, either by direct contact or via a light-conducting contact element, produces the connecting points 22 or serves to bond the coil wire 21 to the contact surfaces of the chip.

Figure 2:
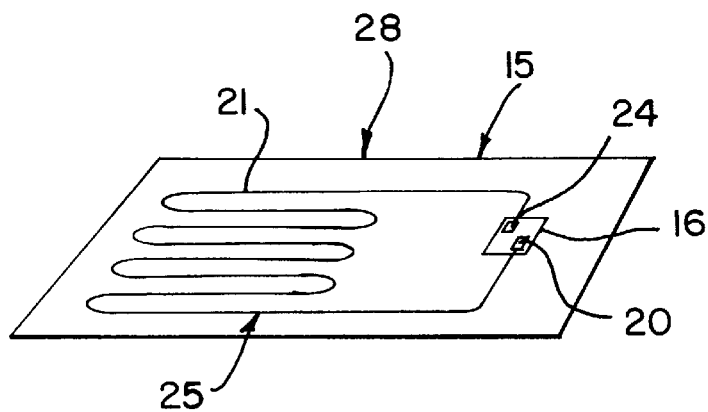
FIG. 2 shows, by way of example, a design version of a chip-mounting board produced using the procedure illustrated in FIG. 1.
Figure 3:
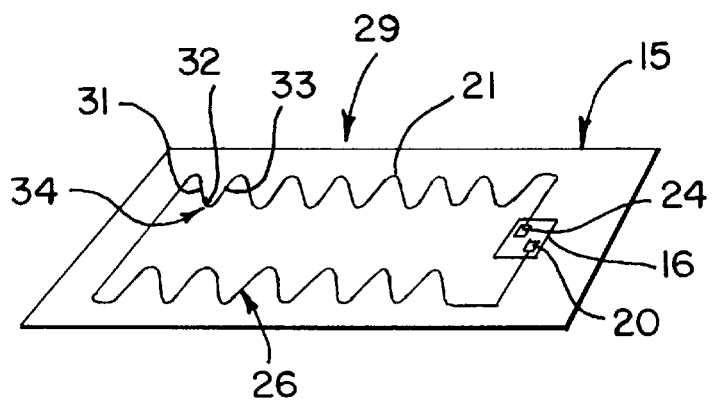
FIG. 3 shows another design version of the chip-mounting board.
Figure 4:
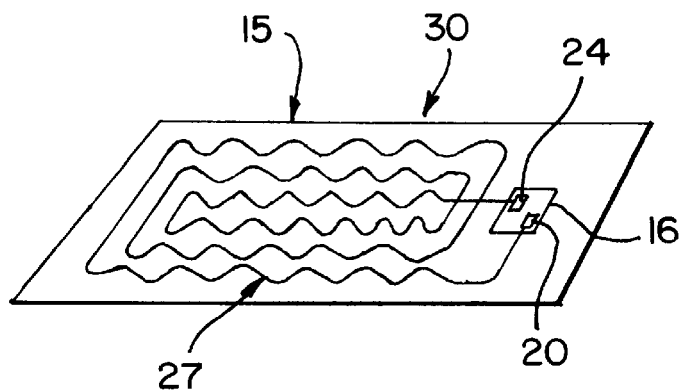
FIG. 4 shows yet another design version of the chip-mounting board.

FIGS. 2 to 4 show examples of other possible layout patterns for mounting the coil wire 21 on the surface of a substrate 15 in a way as to form coils 25, 26 or 27 and for establishing the connection between the coil wire 21 and the contact surfaces 20, 24 of the chip 16, in each case creating differently configured transponder units 28, 29, 30 on the substrates 15. For the purpose of producing the meandering layout pattern shown here by way of example, several connecting points 31, 32 and 33, respectively, are provided between the coil wire 21 and the surface of the substrate 15 so as to form the serpentine pattern 34 of the coil wire.

Figure 5:
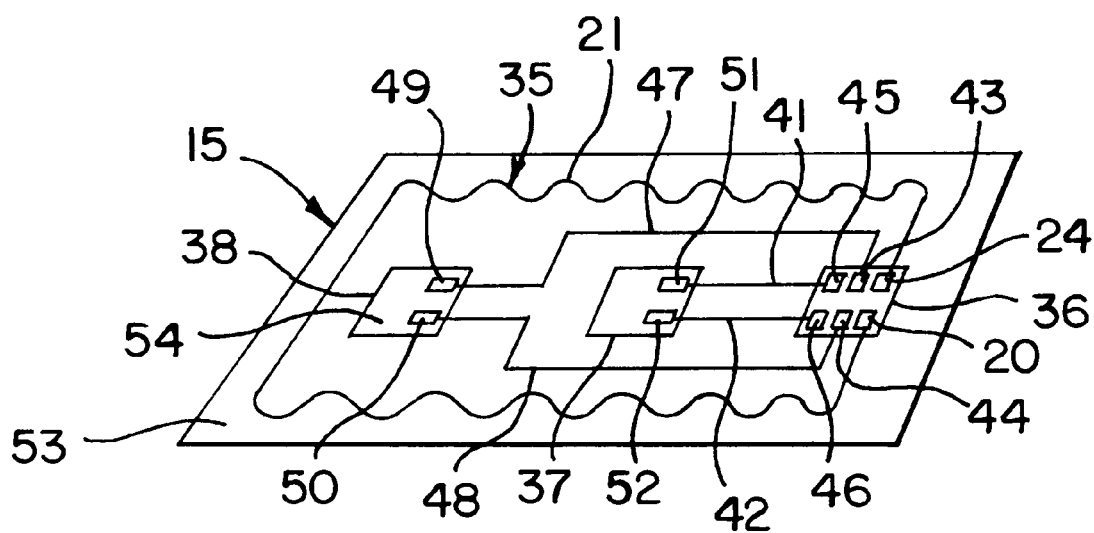
FIG. 5 shows a design version of the chip-mounting board according to this invention, incorporating a multi-component assembly.

It will be evident from the illustration in FIG. 5 that the placement of the coil wire 21 on the surface of the substrate 15 can be used not only for creating a coil 35 but also for running interconnecting wires 41, 42, 47, 48 between contact surfaces 20, 24, 43 to 46 and 49 to 52 of individual components 36, 37 and 38. The example of an assembly shown in FIG. 5 includes a chip 36, a battery element 37 and a touch-sensitive membrane-type key 38. In this case the coil wire 21 of the coil 35 is connected to the contact surfaces 20, 24. The interconnecting wires 41, 42 extend between the contact surfaces 43 and 44, respectively, of the battery element 37 and the contact surfaces 45 and 46, respectively, of the chip 36. The interconnecting wires 47, 48 link the contact surfaces 49 and 50 of the touch-sensitive key 38 respectively to the contact surfaces 51 and 52 of the chip 36.

The interconnecting wires 41, 42 and 47, 48 may be of the same coil wire 21 as the coil 35 and, in the same way as the coil wire forming the coil 35, they may be installed on the surface of the substrate 15 and bonded to the contact surfaces of the components by means of the embedding/bonding device 10.

As indicated by the shaded area in FIG. 5, the surface of the substrate 15 along with the components 36, 37 and 38 as well as the coil 35 and the interconnecting wires 41, 42, 47, 48 mounted thereon may be provided with a covering layer 53, leaving exposed only a contact window 54 for the touch-sensitive key 38. The covering layer 53 may for instance be in the form of a laminate or may be adhesively applied on the surface of the substrate 15 in any other suitable fashion.

Figure 6:
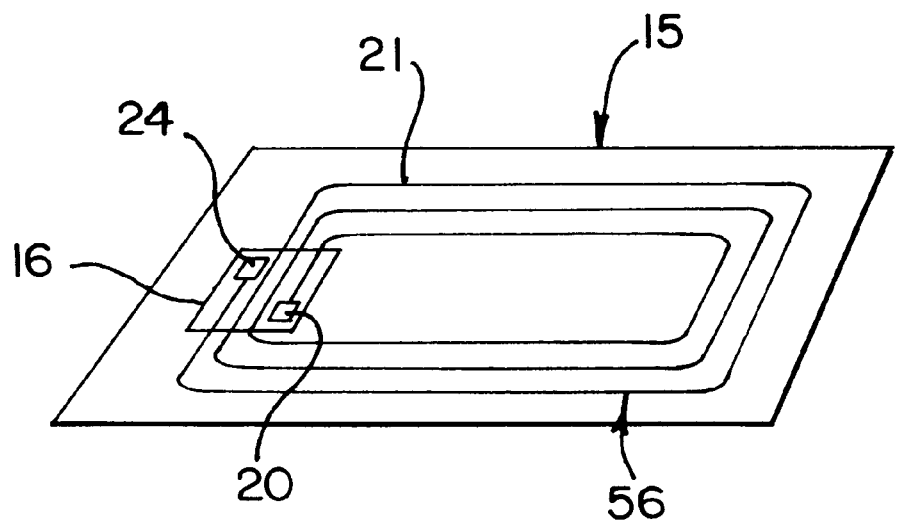
FIG. 6 shows another design variation of the chip-mounting board.

FIG. 6 shows a chip card on which the coil wire 21 used to produce a coil 56 is first connected to the contact surface 20 whereupon, in laying out the coil, each winding is carried across the surface of the chip 16 and the coil is ultimately connected to the second contact surface 24. In this fashion, it is not necessary as in the design per FIG. 4 to run the coil wire across the windings of the coil in order to establish the connection with the second contact surface. This allows for the production of particularly thin chip cards i.e. chip-mounting boards.

What is claimed is:

1. Procedure for producing a transponder unit (55) having at least one chip (16, 36) and one coil (18, 35), and in particular a chip-mounting board (17), wherein the chip and the coil are mounted on one common substrate (15) and the coil is formed by installing a coil wire (21) and connecting the coil-wire ends (19, 23) to the contact surfaces (20, 24) of the chip on the substrate.

2. Procedure as in claim 1, characterized in that,
as a first step prior to the installation of the coil wire (21), one coil-wire end (19) is connected to a first contact surface (20) of the chip (16, 36), the coil wire (21) is then installed to form the coil (18, 35), whereupon the leading end (23) of the coil wire is connected to a second contact surface (24) of the chip, while in the process of the coil-wire installation the coil wire (21) is bonded to the substrate (15) at least in some locations.

3. Procedure as in claim 1, characterized in that,
in the course of the application of the chip (16, 36) on the substrate (15), the chip is bonded to the substrate.

4. A process for the manufacture of a transponder unit (55) including at least one chip (16, 36) and one coil (18, 35), in particular, a chip card (17) in which the chip and the one coil are placed on a common substrate (15), comprising the step of
   (a) forming the coil by laying a coil wire (21) having wire ends (19, 23) and connecting the coil wire ends to contact surfaces (20, 24) of the chip on the substrate.

5. A process for the manufacture of a transponder unit (55) including at least one chip (16, 36) and one coil (18, 35) comprising a coil wire (21) having wire ends (19, 23), in particular, a chip card (17), in which the chip and the one coil are placed on a common substrate (15), comprising the following steps in the sequence set force:
   (a) connecting the first wire end (19) with a first contact surface (20) of the chip (16,36);
   (b) forming the one coil (18,35) by laying the coil wire (21);
   (c) connecting the second (23) coil wire end with a second contact surface (24) of the chip (16,36), and connecting the coil wire (21) with at least one place on the substrate (15).

6. The process in accordance with claim 4, further comprising the step of connecting the chip (16, 36) to the substrate (15).

7. A chip card comprising
a transponder unit (55) including a substrate (15);
at least one chip (16, 36) and at least one coil (18, 35) associated to the at least one chip, the at least one coil is formed of at least one wire winding having wire ends (19, 23);
the at least one chip (16, 36) includes contact surfaces (20, 24);
the wire ends (19, 23) being connected to the contact surfaces (20, 24);
the coil is positioned on the substrate and is bonded to the substrate in at least one place.

8. The chip card in accordance with claim 7, wherein the wire winding is positioned on the substrate in a zig-zag manner.

9. The chip card in accordance with claim 7, wherein the transponder unit further comprises at least one electronic component (37, 38), having associated with it contact surfaces and a component coil formed of wire windings having wire ends;
the at least one electronic unit being placed on the substrate (15) along with the at least one chip (16, 36).

10. The chip card in accordance with claim 9, wherein one of the at least one electronic components is a membrane push-button (38).

11. The chip card in accordance with claim 9, wherein one of the at least one electronic components is a membrane key pad.

12. The chip card in accordance with claim 9, further comprising a top layer (53) connected to the substrate which top layer at least partially covers the substrate.

* * * * *